(12) United States Patent
Adams

(10) Patent No.: US 7,057,871 B2
(45) Date of Patent: Jun. 6, 2006

(54) ACTUATION CIRCUIT FOR AN ELECTROMAGNETIC ACTUATOR

(75) Inventor: Hans Adams, Cologne (DE)

(73) Assignee: Ebern Kammerer KG (DE)

(*) Notice: Subject to any disclaimer, the term of this patent is extended or adjusted under 35 U.S.C. 154(b) by 0 days.

(21) Appl. No.: 10/891,148

(22) Filed: Jul. 15, 2004

(65) Prior Publication Data
US 2005/0013078 A1    Jan. 20, 2005

(30) Foreign Application Priority Data
Jul. 16, 2003    (DE) ................. 103 32 250

(51) Int. Cl.
*H01H 47/00*    (2006.01)

(52) U.S. Cl. ........................................ 361/139

(58) Field of Classification Search ............... 361/139, 361/155, 156
See application file for complete search history.

(56) References Cited

U.S. PATENT DOCUMENTS

| | | | | | |
|---|---|---|---|---|---|
| 3,555,193 A | * | 1/1971 | Brand et al. | ................. | 379/131 |
| 3,751,714 A | * | 8/1973 | Cooper | ................... | 315/241 P |
| 4,038,019 A | * | 7/1977 | Matthews | ..................... | 431/51 |
| 4,340,355 A | * | 7/1982 | Nelson et al. | ................. | 431/20 |
| 4,697,221 A | * | 9/1987 | Pasquarella | ................. | 361/156 |
| 4,890,184 A | * | 12/1989 | Russell | ......................... | 361/87 |
| 5,291,143 A | * | 3/1994 | Cronauer | ..................... | 327/181 |
| 5,796,223 A | * | 8/1998 | Ohtsuka et al. | ............. | 318/126 |
| 5,883,776 A | * | 3/1999 | Keegan et al. | ............. | 361/156 |
| 5,905,625 A | * | 5/1999 | Schebitz | ..................... | 361/154 |
| 6,542,324 B1 | * | 4/2003 | Galbiati et al. | ............... | 360/75 |

* cited by examiner

*Primary Examiner*—Brian Sircus
*Assistant Examiner*—Z Kitov
(74) *Attorney, Agent, or Firm*—Diller, Ramik & Wight

(57) ABSTRACT

The actuation circuit for an actuator (10) includes an energy store (11) arranged near the actuator (10). The energy store (11) is configured such that it instantaneously discharges in response to a trigger signal, wherein the discharge current or voltage is limited to that amount which is required to operate the actuator (10). This ensures rapid response of the actuator (10) without an overshoot of the discharge energy occurring.

10 Claims, 2 Drawing Sheets

ACTUATION CIRCUIT FOR AN ELECTROMAGNETIC ACTUATOR

BACKGROUND OF THE INVENTION

1. Field of the Invention

The invention relates to a actuation circuit for an electromagnetic actuator having an electrical time constant and a switching threshold and comprising an energy store connectable to a supply voltage, said energy store being adapted to be connected via at least one switch with the actuator.

2. Description of Related Art

Actuation circuits for electromagnetic actuators are frequently used in the vicinity of explosion-endangered areas, for example in the chemical industry. A typical application are actuators for valves, e.g. linear actuators for shut-off valves. These valves serve for very rapidly switching on or off mass or volume flows in protective systems, or for very rapidly pilot-controlling suitable shut-off devices and thus for carrying out switching actions. Operation of electromagnetic actuators requires supply of very high energies for a short time. When the energy required for the switching action must be fed through the explosion-endangered area, the respective lines must be routed in an explosion-proof manner. This involves a considerable expenditure. It is further common practice to provide an energy store near the actuator, wherein the trigger signal is fed as a relatively weak electrical signal through the explosion-endangered area to the energy store. The energy stores are normally accumulators or capacitor batteries.

It is often necessary to operate actuators very quickly. When, for operating the actuator, an energy store is discharged, this often involves a considerable delay of several seconds. For accelerating the actuating process, the charging voltage of the energy store can be increased. This however increases the danger of explosion in an explosion-endangered environment. Further, there is the danger that the soft-iron core included in an actuator is driven to saturation by too high a voltage. Permanent magnets may become damaged if the coercive force is exceeded.

SUMMARY OF THE INVENTION

It is an object of the present invention to provide a actuation circuit for an electromagnetic actuator, wherein said actuation circuit has short response times and does not provoke any dangerous situations.

According to the present invention, the energy store is configured such that it supplies, after connection to the actuator and within a period of time which is shorter than the time constant of the actuator, a current or a voltage of predetermined magnitude which does not exceed the switching threshold of the actuator by more than 20%. The energy store sets the current or the voltage for operating the actuator to the required level within a short time, without an essential overshoot occurring. The energy store is charged during the waiting period and maintained in the charged state. The energy store builds up the required current with a high rise rate. Thus discharge does not take place according to an exponential function but by impressing a current or a voltage with predetermined time characteristics.

There a several ways of realizing the energy store with the required properties. A preferred way is to design the energy store as an LC chain with numerous series-mounted inductors and transversely mounted capacitors. Such an LC chain, which is connected to a mean charging voltage, is permanently maintained in the charged state and discharged by operating the switch. During the discharging process, all capacitors are discharged simultaneously, wherein a current of a predetermined and constant magnitude is practically instantaneously impressed into the actuator. The LC chain thus generates a rectangular current pulse. Preferably, the capacitors have identical capacitance values and associated coils have identical inductance values.

Another way of realizing the energy store is to use a voltage multiplier comprising a plurality of series connections of diodes and capacitors. Such a voltage multiplier generates a voltage curve in the form of a steep and high rectangular pulse. After decay of the rectangular pulse the curve descends to a lower amplitude.

The LC chain or the voltage multiplier is to be rated such that it is adapted to the electrical characteristics of the actuator which generally can be considered to be a combination of R and L.

Another way of realizing the energy store is to provide a controlled current or voltage source whose output is limited. The current or voltage source generates a constant current or a voltage with a predetermined curve such that the desired rectangular form of the operating signal for the actuator can be obtained by electronic control.

According to a preferred variant of the present invention, the supply voltage for generating a trigger signal for operating the at least one switch is adapted to be subjected to pole changing. Such pole changing is easily detectable by a corresponding diode circuit. In particular, the detection does not require any predefined voltage level. Such detection can thus be easily and reliably carried out.

According to a preferred variant of the present invention, the actuator is connected in series with a closed circuit which comprises at least one closed-circuit relay. In the idle state, the energy store causes a closed-circuit current to flow. The non-appearance of the closed-circuit current is detected and leads to initiation of special measures, such as tripping of the shut-off valve for the purpose of holding off dangerous substances. The voltage level of the electrical energy store, as from which a closed-circuit current is to flow, can e.g. be produced by a Zener diode. Thus it can be ensured that below a given voltage level a "fault" is always detected so that the shut-off device is closed and remains closed. Since the charging and closed-circuit currents are fed through the same lines, non-appearance of the closed-circuit current is provoked by the following events:

1. Line interruption, including failure of current supply at the input,
2. Energy store not yet charged,
3. Store circuit defective.

The invention further relates to a method for actuating an electromagnetic actuator. In this method, current or voltage of a predetermined magnitude is applied to the actuator within a period of time which is shorter than the time constant of the actuator, said magnitude not exceeding the switching threshold of the actuator by more than 20%, preferably more than 10%. This ensures that neither magnetically soft components are driven beyond saturation nor the coercive force of the permanent magnets used is exceeded.

BRIEF DESCRIPTION OF THE DRAWING(S)

Hereunder embodiments of the present invention are explained in detail with reference to the drawings. The drawings and the detailed description of embodiments help to better understand the invention, they may however not be construed as restricting the scope of protection which is rather defined by the following claims.

DETAILED DESCRIPTION OF PREFERRED EMBODIMENTS OF THE INVENTION

Figure 1:
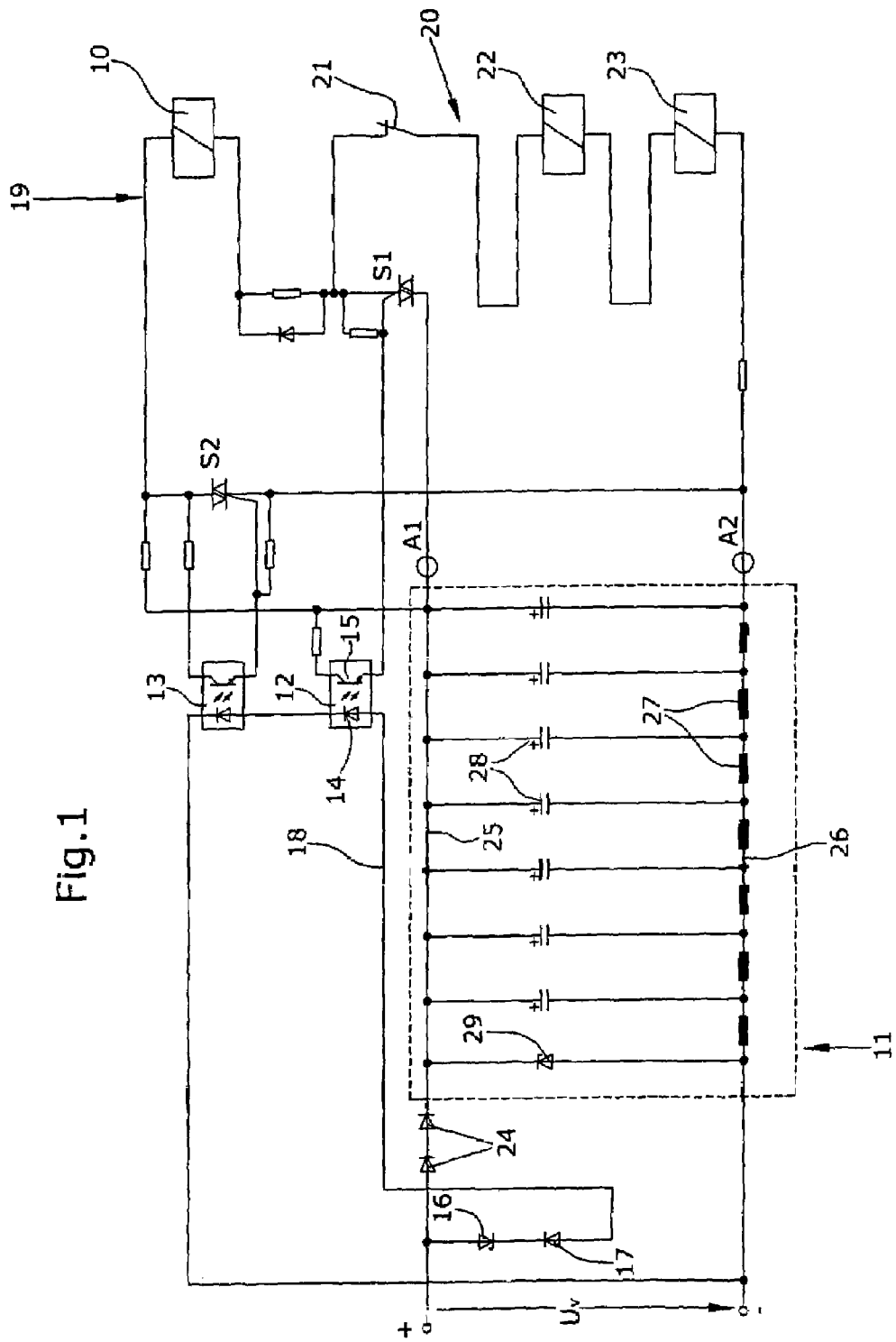
FIG. 1 shows a circuit diagram of a first embodiment of the actuation circuit.

The actuation circuit shown in FIG. 1 is supplied with a supply voltage $U_v$ which here is a DC voltage of, for example, 70 volts. The supply voltage is applied to an energy store 11 arranged near the actuator 10. The actuator 10 is an electromagnetic actuator serving for carrying out a movement. For example, the actuator 10 operates a shut-off valve which shuts off or opens a conduit through which a substance flows. The actuator 10 is, for example, a plunger-type coil. The actuator 10 comprises an electromagnet which constitutes an inductor and an ohmic resistor. The actuator 10 has a switching threshold, i.e., a given current or voltage level must be exceeded for operation of the actuator. The actuator 10 is connected via a first electronic switch S1 with the first pole A1 of the output of the energy store 11 and via a second electronic switch S2 with the second pole A2 of the output. The energy store 11 is switched off in a bipolar manner by the electronic switches S1 and S2. The electronic switches S1 and S2 are TRIACs. The switch S1 is controlled via an optocoupler 12, and the switch S2 is controlled via an optocoupler 13. Each optocoupler conventionally comprises a light-emitting diode 14 and a phototransistor 15 which receives the light from the light-emitting diode 14. Thus a galvanic separation between input and output of the optocoupler is realized. The two optocouplers 12,13 are serially connected to the supply voltage $U_v$, wherein the series connection further includes a Zener diode 16 and a diode 17. The cathode of the diode 17 faces the positive pole of the supply voltage $U_v$. The actuation instruction for operating the actuator 10 causes a polarity reversal of the supply voltage $U_v$. Then the diode 17 becomes conductive and current flows through the series connection 18, wherein signals are sent via the optocouplers 12,13, which signals drive the switches S1 and S2 into the conducting state. The polarity reversal of the supply voltage is carried out with the aid of a pole-reversing circuit. As an alternative to a pole reversal, the trigger signal can be generated by changing the phase positions of a plurality of output AC voltages relative to each other.

The electric circuit, which comprises the switches S1 and S2 and the actuator 10, is connected to a closed circuit 20. One end of the closed circuit 20 is connected to the connection between the actuator 10 and the switch S1. The other end is connected with the pole A2 of the energy store 11. The closed circuit 20 includes a sensor 21 configured as a pressure sensor which interrupts the closed circuit 20 when a given pressure is exceeded or not reached, thus indicating a fault. The closed circuit 20 further includes an indicator relay 22. If the closed-circuit current does not reach the hold current of this relay 22, the polarity is reversed at the polarity-reversing device. This ensures that a fault is reliably indicated.

Finally, the closed circuit 20 includes a closed-circuit relay 23 which actively keeps a valve in the closed state. If the closed-circuit current exceeds the hold current of the closed-circuit relay 23, the valve is opened and, in turn, rapidly or slowly closes the shut-off device. Thus it is ensured that the shut-off device is forcedly kept closed as long as the electrical energy store 11 is not in the charged condition.

With the aid of the closed circuit 20 the actuation circuit including the energy store 11 is self-monitoring and further monitors the connected units. If a fault is detected, closing of the shut-off device is initiated, the fault is indicated, and the shut-off device is prevented from being opened.

Further, detection of a fault can be notified to a second actuation system which operates on a different auxiliary energy, e.g. compressed air, such that the shut-off device is closed with the aid of the auxiliary energy. The closed circuit 20 is supplied with the output voltage of the energy store 11. The closed-circuit current flows only if the output voltage of the energy store 11 is not zero and the closed circuit is not interrupted.

Upstream of the input of the energy store 11 two diodes 24 are arranged which have an opposite polarity relative to the diode 17. The energy store 11 includes a through line 25 and a line 26 which comprises numerous series-connected inductors 27. Between two respective inductors the line 26 is connected via a capacitor 28 to the through line 25. All inductors 27 are identical and all capacitors 28 are identical. The inductors 27 and the capacitors 28 constitute an LC chain with series-mounted inductors and transversely mounted capacitors. At the input of the energy store 11 a Zener diode 29 for stabilizing the input voltage is arranged. The poles A1 and A2 of the output of the energy store 11 are constituted by the terminals of the last capacitor 28.

Figure 2:
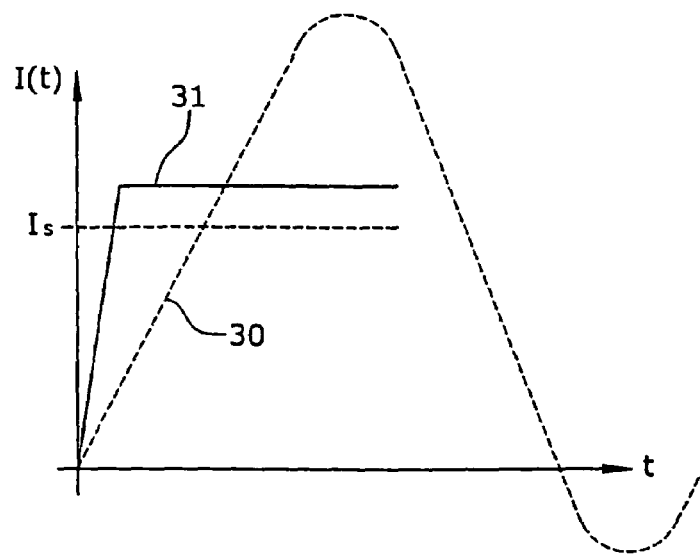
FIG. 2 shows the time characteristics of the driving signal for the actuator.

The energy store 11 is permanently charged by the supply voltage $U_v$ and kept in the charged state as long as the switches S1 and S1 are in the off-state. If these switches S1,S2 are driven into the conducting state, the current curve I(t) shown in FIG. 2 is generated. $I_s$ is the switching threshold of the actuator 10, i.e. that current which is required by the actuator 10 for performing its function. It can be seen that, after the trigger signal, the current I very rapidly rises to the final value and maintains this final value for a certain period of time. The energy store 11 thus discharges without any essential delay and at a current value which remains constant for a certain period of time.

In contrast, the current 30 shown by dashed lines in FIG. 2 would occur if the energy store 11 would comprise only one large capacitor. Since such a capacitor forms an oscillating circuit with the inductor of the actuator 10, the switching threshold would be reached at a considerably later time. The discharge current of the capacitor would overshoot by far and drive the magnet of the actuator 10 far beyond saturation.

On the other hand, the current 31 rises rapidly and has a constant current intensity which does not essentially exceed the switching threshold $I_s$.

Figure 3:
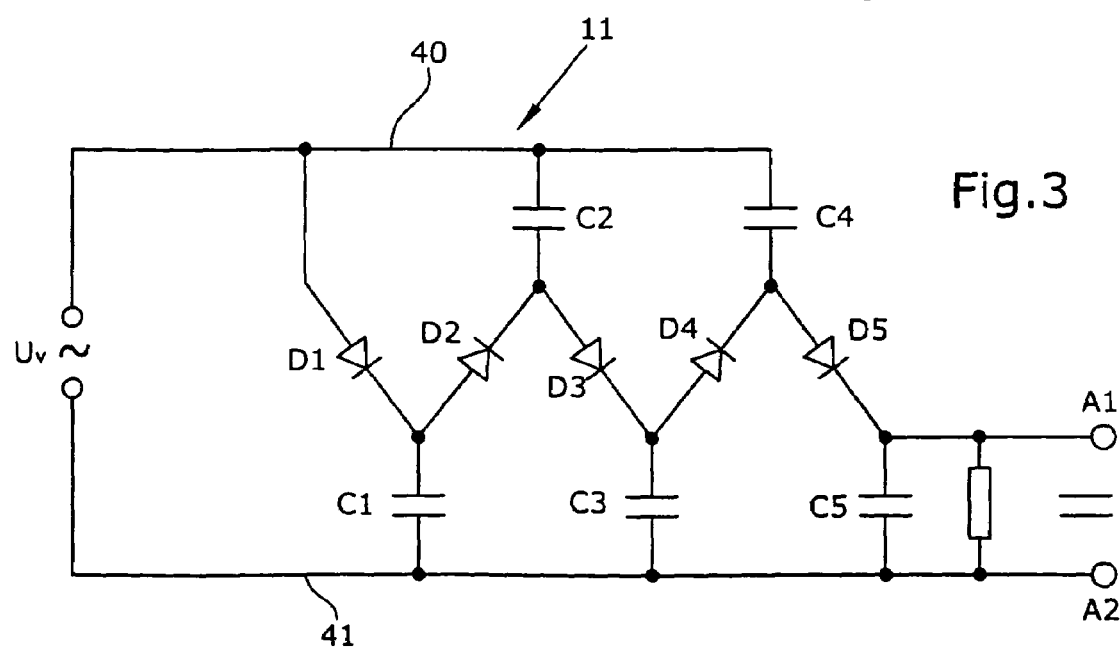
FIG. 3 shows a modified embodiment of the energy store configured as a voltage multiplier.

FIG. 3 shows another embodiment of an energy store 11. In this embodiment, two through lines 40,41 are provided which are connected to an AC voltage of, for example, 16 volts. The through line 41 is connected with capacitors C1,C3,C5, and the other through line 40 is connected with capacitors C2,C4. The capacitor terminals, which are not connected with a through line, are connected with a respective diode. The diodes D1,D2,D3,D4 and D5 are connected in series, wherein the diode D1 is directly connected with the through line 40. In a voltage multiplier the DC voltages occurring at the capacitors C1–C5 are added up. This is a voltage source providing a high voltage which is higher than the supply voltage and decreases to a lower holding value after a predetermined period of time.

Figure 4:
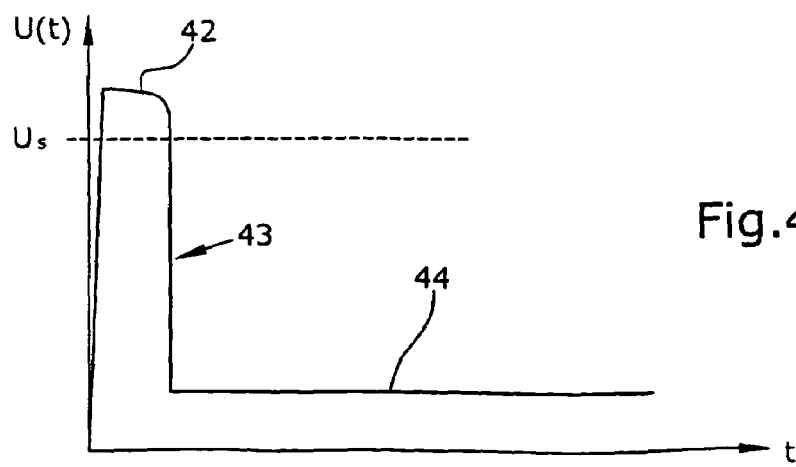
FIG. 4 shows the curve of the driving voltage in the embodiment shown in FIG. 3.

This is shown in FIG. 4 where the time characteristics of the voltage U(t) provided by the energy store 11 of FIG. 3 is illustrated. Here, the switching threshold of the actuator 10 is designated $U_s$. It can be seen that the curve 43 first rapidly rises to the maximum value 42 which is a multiple of the supply voltage $U_v$ and is essentially determined by C5. Then the curve 43 decreases to a lower voltage 44 which characterizes the stationary state and is to a large extent determined by C1.

Irrespective of the type of the respective energy store 11, the output impedance of the energy store 11 should be adapted to the input impedance of the actuator 10. Such an adaptation allows the required switching energy to be limited to a maximum of one tenth of the energy required heretofore according to the prior art, without an essential deterioration of the electrical actuation characteristic being caused.

Although the invention has been described and illustrated with reference to specific illustrative embodiments thereof, it is not intended that the invention be limited to those illustrative embodiments. Those skilled in the art will recognize that variations and modifications can be made without departing from the true scope of the invention as defined by the claims that follow. It is therefore intended to include within the invention all such variations and modifications as fall within the scope of the appended claims and equivalents thereof.

What is claimed is:

1. An actuation circuit for an electromagnetic actuator (10) having an electrical time constant and a switching threshold and comprising an energy store (11) connectable to a supply source, said energy store (11) being adapted to be connected by at least one switch (S1,S2) to the actuator (10), the energy store (11) being configured to supply, after connection with the actuator (10) and within a period of time which is shorter than the electrical time constant of the actuator (10), one of a current and a voltage of predetermined magnitude which exceeds the threshold ($I_s$, $U_s$), the energy store (11) including an LC chain of a plurality of series-mounted inductors (27) and transversely mounted capacitors (28), and the LC chain having a first end that is connected with poles of a DC source and a second end which is connected by two poles (A1, A2) with a series circuit containing the actuator (10) and the at least one switch (S1, S2).

2. The actuation circuit according to claim 1, wherein the energy store (11) includes a voltage multiplier formed by a plurality of series connections of diodes (D1–D5) and capacitors (C1–C5).

3. The actuation circuit according to claim 1, wherein the energy store (11) is one of a controlled current and voltage source whose output is limited.

4. The actuation circuit according to claim 1, wherein the switch (S1,S2) is an electronic switch which is controlled in a galvanically separated manner.

5. The actuation circuit according to claim 1, wherein a switch (S1,S2) is included in each of the two connecting lines of the actuator (10).

6. The actuation circuit according to claim 1, wherein the actuator (10) is series-connected with a closed circuit (20) which includes at least one closed-circuit relay (23).

7. The actuation circuit according to claim 1, wherein the closed circuit (20) includes at least one sensor (21) configured as an interrupter switch.

8. The actuation switch according to claim 6, wherein the closed circuit (20) is supplied from the output of the energy store (11).

9. An actuation circuit for an electromagnetic actuator (10) having an electrical time constant and a switching threshold and comprising an energy store (11) connectable to a supply source, said energy store (11) being adapted to be connected by at least one switch (S1,S2) to the actuator (10), the energy store (11) being configured to supply, after connection with the actuator (10) and within a period of time which is shorter than the electrical time constant of the actuator (10), one of a current and a voltage of predetermined magnitude which exceeds the threshold ($I_s$, $U_s$), the energy store (11) including a voltage multiplier formed by a plurality of series connected diodes (D1–D5) and capacitors (C1–C5), each capacitor being connected by a first end to one of two terminals of an AC source, and each diode connecting second ends of two capacitors.

10. An actuation circuit for an electromagnetic actuator (10) having an electrical time constant and a switching threshold and comprising an energy store (11) connectable to a supply source, said energy store (11) being adapted to be connected by at least one switch (S1,S2) to the actuator (10), the energy store (11) being configured to supply, after connection with the actuator (10) and within a period of time which is shorter than the electrical time constant of the actuator (10), one of a current and a voltage of predetermined magnitude which exceeds the threshold ($I_s$, $U_s$), the actuator (10) being series-connected with a closed circuit (20) which includes at least one closed-circuit relay (23), and the closed circuit (20) being supplied from the output of the energy store (11).

* * * * *